United States Patent
Vogt

[11] Patent Number: 5,886,297
[45] Date of Patent: Mar. 23, 1999

[54] METHOD AND APPARATUS FOR SEALING, ON A NON-PERMANENT BASIS, A HOUSING FOR ENCLOSING ELECTRONIC EQUIPMENT

[76] Inventor: William R. Vogt, 112 Jordan Rd., Rockaway, N.J. 07866

[21] Appl. No.: 808,185

[22] Filed: Feb. 28, 1997

[51] Int. Cl.[6] .............................. H01J 5/20; H05K 5/06
[52] U.S. Cl. ................. 174/50.5; 174/65 G; 174/152 G; 174/153 G; 215/358; 215/361; 220/234
[58] Field of Search ............................ 174/50.5, 66, 135, 174/65 G, 152 G, 153 G, 151; 248/56; 16/2.3, 2.5; 215/277, 358, 361; 220/3.8, 241, 233, 234, 255, 256, 780, 784

[56] References Cited

U.S. PATENT DOCUMENTS

| | | | |
|---|---|---|---|
| 3,056,852 | 10/1962 | Sachs | 174/153 G |
| 3,937,350 | 2/1976 | Völker | 215/361 |
| 4,056,252 | 11/1977 | Simon | 248/56 |
| 4,089,496 | 5/1978 | Mizusawa | 174/156 G X |
| 4,095,765 | 6/1978 | Aimar | 248/56 |
| 4,178,057 | 12/1979 | McCormick | 174/135 X |
| 4,256,920 | 3/1981 | Ayres et al. | 174/151 X |
| 4,259,542 | 3/1981 | Tehan et al. | 248/56 X |
| 4,265,420 | 5/1981 | McCormick | 174/3 |
| 4,627,647 | 12/1986 | Hauff | 174/65 G X |

*Primary Examiner*—Dean A. Reichard
*Attorney, Agent, or Firm*—Polster, Lieder, Woodruff & Lucchesi, LC

[57] ABSTRACT

A housing assembly (20) for protecting electronic components. An enclosure (21) is open at one end (22). Electronic components are housed in the enclosure. A bung member (25) is insertable into the open end of the enclosure to seal the enclosure. The member defines a channel (27) and a spreader element (28) is insertable into the channel. The spreader element is formed to cause the bung member to expand upon insertion of the spreader to seal the enclosure against moisture and contaminants.

9 Claims, 4 Drawing Sheets

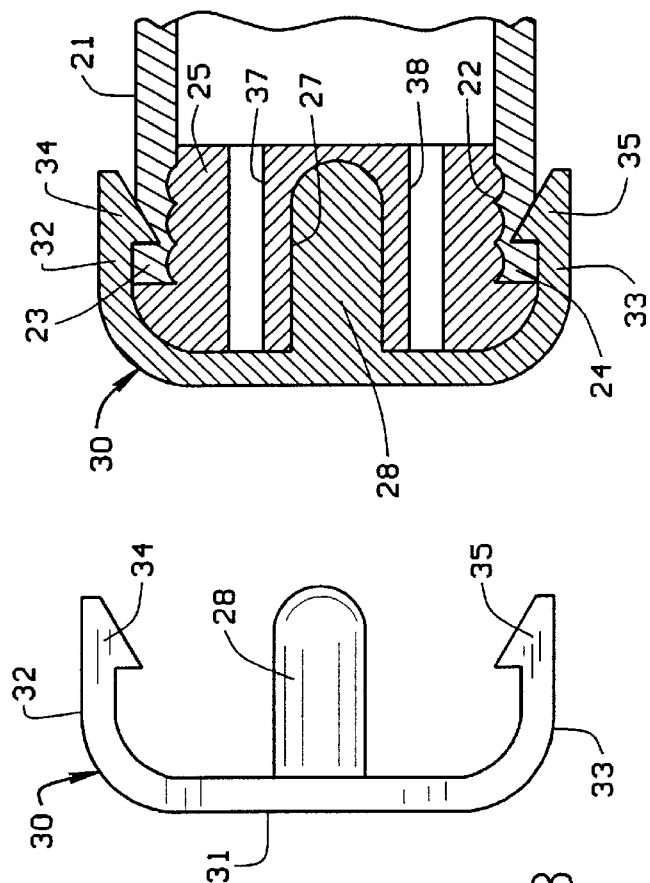
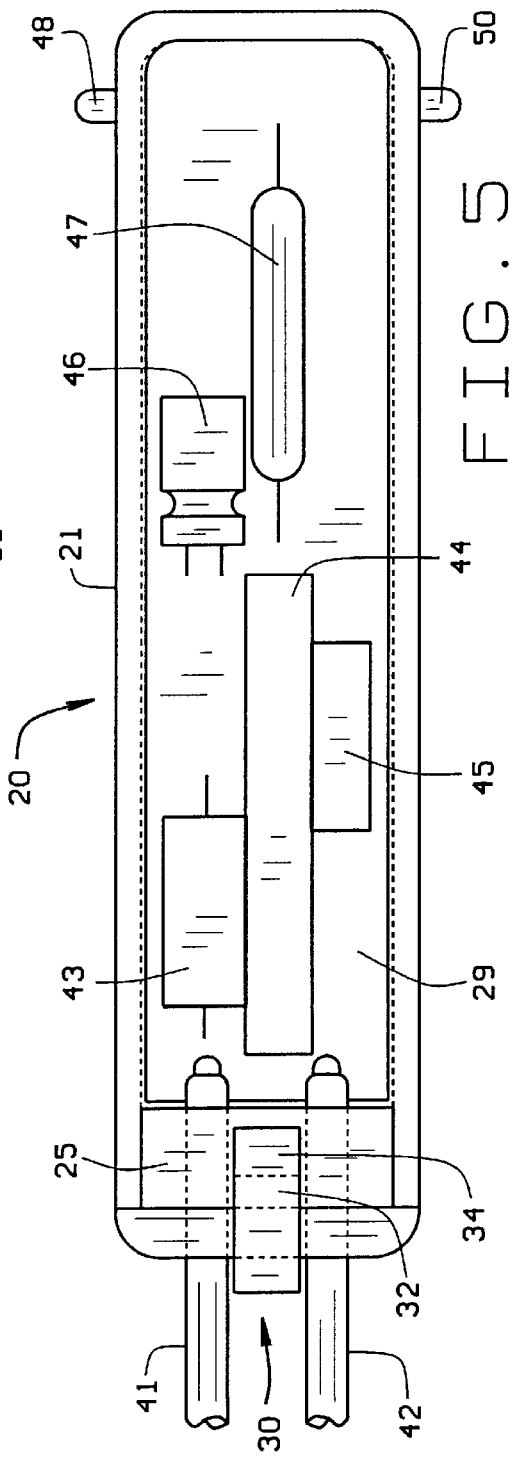

METHOD AND APPARATUS FOR SEALING, ON A NON-PERMANENT BASIS, A HOUSING FOR ENCLOSING ELECTRONIC EQUIPMENT

BACKGROUND OF THE INVENTION

The present invention is directed to a housing for enclosing electronic or other sensitive equipment, and more particularly to such a housing which effects a waterproof seal for any component positioned within the housing. In addition, the invention includes a novel and unobvious method for effecting the seal.

It has been difficult and expensive to provide enclosures and housings for equipment of the type which includes printed circuit boards and similar delicate, precision equipment. Various attempts have been made to provide effective, economical housings which can readily accommodate such equipment, and into which the equipment may be easily and rapidly inserted, followed by a quick and easy sealing of the housing or enclosure. Also important is the need for such an arrangement which can easily be removed for servicing a component, or resetting of a switch, followed by return of the assembly to its original sealed condition with a minimum of difficulty and expense. All earlier attempts to solve this problem have not attained the requisite ease, effectiveness and economy of operation. For example some producers use a "potting" process, wherein the sensitive components are first inserted into the container, and then a fluid, plastic insulating compound is poured into the container to surround the components. The compound then sets up, or hardens, to prevent the entry of air or moisture which could attack the components. However the hardened compound also prevents removal of the components for servicing, or to change a switch setting, or for any other reason, without destroying the integrity of the potted assembly.

It is, therefore, a principal consideration of the present invention to provide a structure, and a method of assembling and sealing that structure, which overcomes the deficiencies found in the prior art.

SUMMARY OF THE INVENTION

The present invention is directed to a housing assembly for protecting electronic and/or other sensitive components which can be degraded by moisture, wherein an enclosure defines only one opening for receiving the component or components into its interior. An elastomeric bung or closure member has a portion for insertion into the enclosure opening, to effectively close the opening. The closure member has at least one channel extending into, but not through, the closure member; the open end of the channel facing away from the interior of the enclosure. A spreader element has dimensions generally similar to those of the channel, but has a diameter slightly larger than the channel diameter. Upon insertion of the spreader element into the bung member channel, the elastomeric bung member is expanded to effectively seal the enclosure against the entry of moisture.

The method of the invention is practiced by providing an enclosure which is generally closed but provides at least one opening. The electrical components are inserted into the housing interior. An elastomeric closure member is provided, and this member is sized to fit into the enclosure opening. The closure member defines a channel extending into, but not through, the closure member. A bung element has a diameter slightly larger then the diameter of the channel in the closure member. The bung element is inserted into the channel, and this expands the closure member to effectively seal and pressurize the enclosure assembly. This prevents entry of moisture into the enclosure, and also pressurizes the interior of the closure assembly.

THE DRAWINGS

In the several figures of the drawings, like reference numerals identify like components, and in those drawings:

FIG. 3 is a side view of one component, as used in a preferred embodiment of the Invention;

FIG. 4 is a partial sectional view useful in understanding mating of the component shown in FIG. 3 with other components of the invention; and FIG. 5 is a top plan view showing the housing assembly and various circuit components within the assembly;

DETAILED DESCRIPTION OF THE INVENTION

Figure 1:
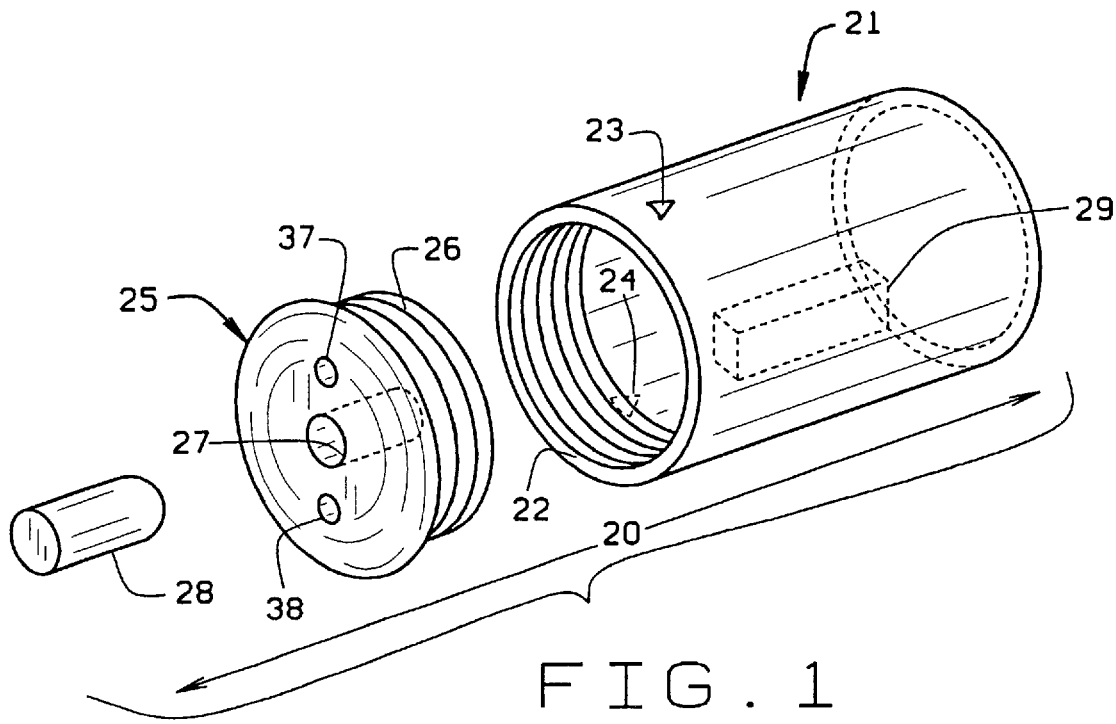
FIG. 1 is an exploded, perspective view of major components of the inventive housing assembly.

FIG. 1 depicts a housing assembly 20 for protecting sensitive components such as electronic circuit boards and transducers. The assembly has a barrel-shaped enclosure 21, which defines only one opening 22 at one end. Enclosure 21 can be formed of polycarbonate or a similar material, and the inside may be polished to provide a smooth finish. The outer surface of enclosure 21 defines a pair of recesses 23 and 24, which are small depressions spaced 180 degrees from each other in the preferred embodiment. The assembly 20 also includes an elastomeric bung or closure member 25 which has a portion for insertion into the opening 22 of enclosure member 21. Ridges 26 are formed on the bung 25 so that, as the bung 25 is inserted into opening 22, the ridges are squeezed and deformed to not only close this opening but also to provide an effective seal for the interior of the enclosure. Elastomeric bung 25 also defines a channel 27 extending from one surface inwardly into, but not completely through, the bung member. The open end of channel 27 faces away from the interior of enclosure 21. Bung member 25 may be made acetane or another suitable material. Assembly 20 also has a spreader element 28, in the shape of a small cylinder, formed of nylon or a similar material. The end of spreader element 28 closer to the bung member is tapered, in the manner of the nose of a bullet. Spreader element 28 has dimensions generally similar to, but a diameter larger than, the diameter of channel 27. Upon insertion of spreader 28 into channel 27, elastomeric bung 25 is expanded as ridges 26 are deformed where they contact the interior of enclosure 21, to effectively seal enclosure 21 against the entry of moisture.

Figure 2:
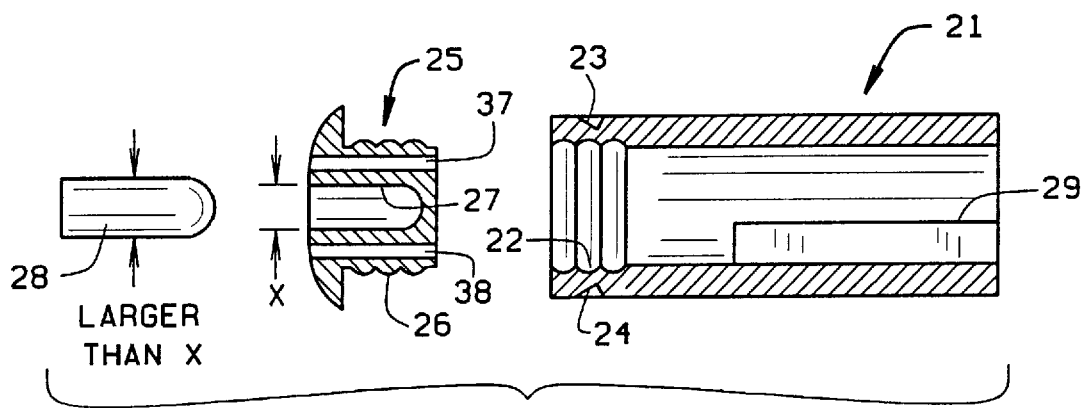
FIG. 2 is an exploded, side view, partially in section, depicting the preferred embodiment of the invention.
Figure 6:
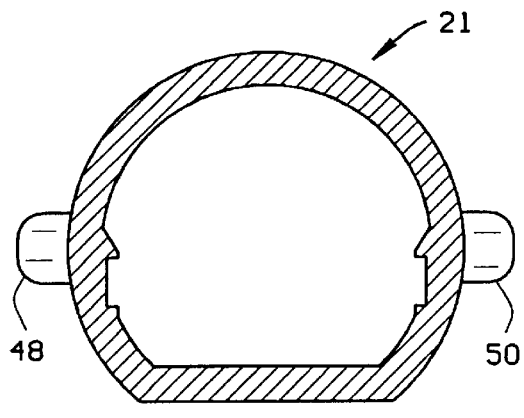
FIG. 6 is a sectional view, taken through the center of the plan view of FIG. 5, useful in understanding the insertion and retention of electronic components within the housing assembly of the invention.
Figure 7:
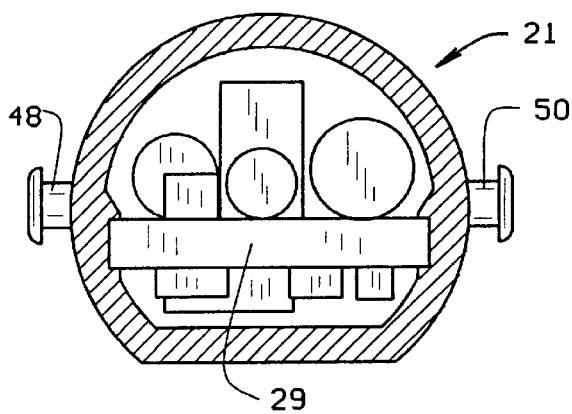
FIG. 7 is a partial cut-away view showing an end of the housing.
Figure 8:
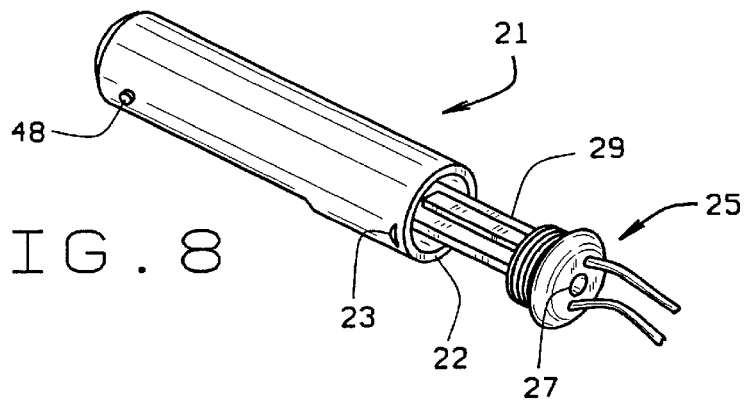
FIGS. 8–11 depict the manner in which the housing assembly can be mated with a faceplate for insertion in a door or wall.
Figure 9:
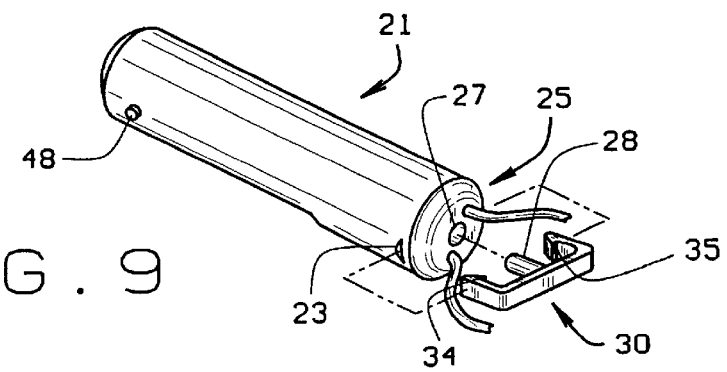
Figure 10:
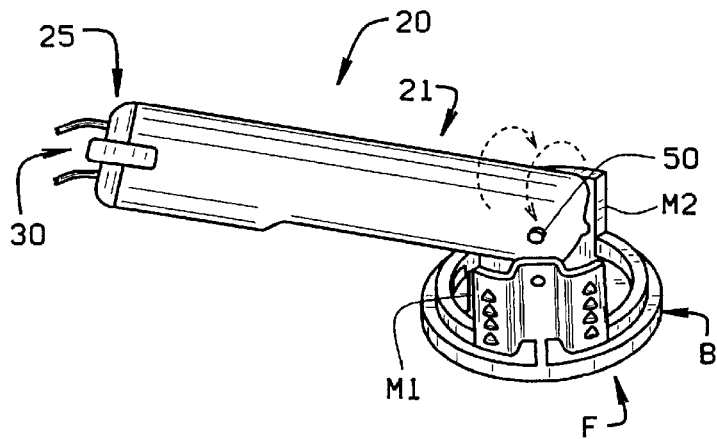

FIG. 2 shows assembly components 28, 25 and 21 before they are mated to form the complete housing. A printed circuit board 29 is depicted in broken lines to indicate the position of the board in the resultant assembly.

In the preferred embodiment of the invention, as shown in FIG. 3, an E-shaped end member 30 carries the spreader element 28 extending from center portion 31 of the E-shaped member. The upper and lower arms 32, 33 of E-shaped member 30 terminate in a pair of oppositely disposed locking tabs 34 and 35. In accordance with an important aspect of the invention, the tabs 34, 35 are sized to fit into the complementary recesses 23, 24 on the outer surface of enclosure 21, when closure member 25 is inserted into the enclosure 21, and end member 30 has its spreader element 28 properly seated in channel 27 of the elastomeric bung. The flexibility of arms 32 and 33 allows the locking tabs 34, 35 to bend outwardly as the E-shaped end member is pushed to the right (as seen in FIG. 4) and spreader element 28 enters channel 27; at the same time, arms 32, 33 flex outwardly until tabs 34, 35 seat in recesses 23, 24 and firmly lock end member 30 and elastomeric bung 25 into the positions shown in FIG. 4. Any pulling force on member 30 attempting to move it to the left (as seen in FIG. 4) will be ineffective, unless the arms 32, 33 are first bent outwardly to move locking tabs 34, 35 out of the mating recesses. This is a significant feature of the invention, in that such locking in place both effects the watertight seal and provides strain relief for the conductors which will pass through cylindrical openings 37, 38 in the elastomeric bung, as will be better understood in connection with FIG. 5.

As there shown, printed circuit board 29 supports a plurality of electronic components which are connected, at the left end of the board, to a pair of electrical conductors 41 and 42, which pass through the just-described channels 37, 38. It has been noted that in some applications only a single conductor may be used, and of course more than two conductors may also be used. Components shown in this top view include a suppressor 43, which may be a Zener diode; a dip switch 44; a crystal 45 for producing a signal with a well-regulated frequency; a capacitor 46; and a reed switch 47. Circuit connections for these components, and other units under the board, are not visible in this top view. What is evident in this view is the use of the bung member 25 to (1) provide an effective, watertight seal for the components within the housing, (2) afford strain relief for the conductors and associated components by the squeezing of the bung material around the conductors, and (3) secure and maintain board 29 in the appropriate position (as shown) by butting up against the end of the board when the housing assembly is put together.

Shown near the right end of enclosure 21 are a pair of oppositely disposed bosses 48, 50, which are positioned diametrically opposite each other. While not necessary for the inventive housing assembly just described, the bosses are particularly useful with a method and structure for providing a pivotal housing for a switch contact or for an enclosure of the type shown in FIG. 5.

Figure 11:
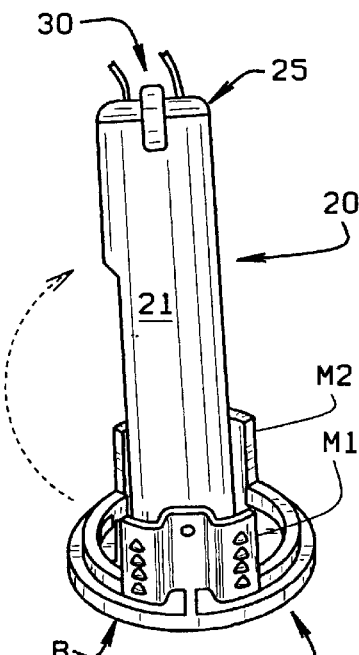

Referring to FIG. 8–11, the respective drawing figures illustrate a faceplate F to which housing assembly 20 is mounted. The faceplate includes a base B and opposed support members M1, M2 extending outwardly from the base. The bosses 48, 50 are received in recesses R1, R2 formed in the respective support members to mount the housing assembly to the faceplate, The completed assembly, which is shown in FIG. 11, is then inserted into an opening in a door or wall (both not shown).

Figure 12:
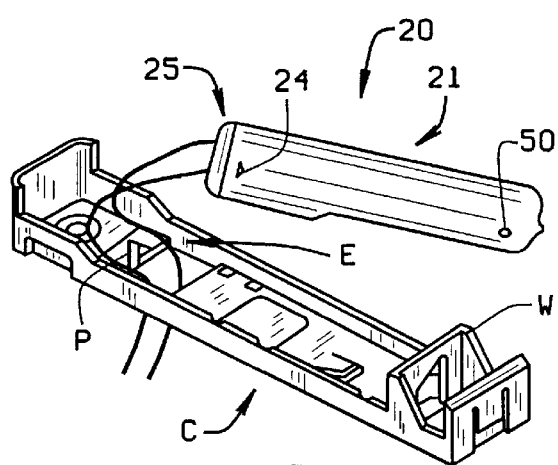
FIGS. 12 and 13 show the manner in which the assembled housing can be mounted to a capsule base.
Figure 13:
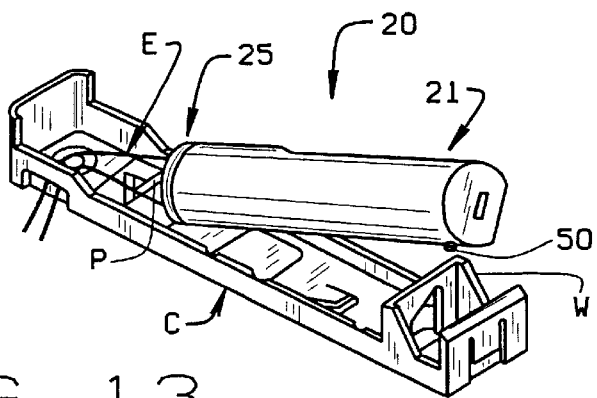

Alternately, and as shown in FIGS. 12 and 13, housing assembly 20 is shown as being installed to a base C. The base has a wall W formed adjacent one end against which one end of the enclosure abuts when housing assembly 20 is installed on the base., A spreader element E is formed at an opposite end of the base and comprises a projection P inserted in channel 27 as the housing assembly is set in place. The dimensions of the spreader element slightly exceed those of channel 27 for insertion of the spreader element into the channel to force the closure member to expand outwardly against a sidewall of the opening and seal the enclosure.

What is claimed is:

1. A housing assembly protecting sensitive electronic components installed therein comprising:

an enclosure having an opening therein for insertion of said components into said enclosure, an outer surface of said enclosure having a pair of recesses formed therein;

a closure member insertable into said opening to close said opening, said closure member having a channel extending into said closure member from one end thereof; and an E-shaped sealing member including a spreader element receivable in said channel, the dimensions of said spreader element slightly exceeding those of said channel for insertion of said spreader element into said channel to force said closure member to expand outwardly, against a sidewall of said opening to effectively seal the enclosure against moisture and other contaminants which may harm said components, and said sealing member further including a pair of locking tabs engaging said recesses when said spreader element is fully inserted in said channel to lock said sealing member in place.

2. The housing assembly of claim 1 wherein said closure member further includes at least one conduit channel extending through the closure member for electrical conductors attached to components housed in said enclosure to be routed through said through channel for electrically connecting said components externally of said enclosure, whereby upon insertion of said spreader element in said channel and engagement of said locking tabs in said recesses, a sidewall of said at least one conduit channel is pressed against said electrical conductors to tightly hold said conductors in place and prevent displacement of said conductors and a component to which they are connected when a portion of the conductor external to said enclosure has a pulling force exerted thereon.

3. The housing assembly of claim 1 wherein said recesses are opposed recesses formed on opposite sides of said enclosure.

4. The housing assembly as claimed in claim 1 wherein said closure member and said, spreader element are each formed of an elastomeric material.

5. The housing assembly of claim 4 wherein said channel is circular in cross-section and said spreader element has a cylindrically shaped body the length of which corresponds to the length of said channel.

6. The housing assembly of claim 5 wherein said closure member includes a cylindrically shaped bung member sized to fit in said opening and a cap portion having a diameter greater tan that of said bung member to fit over an outer end of said opening when said bung member is inserted in said opening, said bung member including a plurality of ridges formed on an outer surface thereof and closely engaging a sidewall of said opening, said opening sidewall having annular recesses formed therein in which said ridges fit, said ridges being pressed tightly into said recesses when said spreader element is inserted in said channel to effectively seal said opening.

7. A housing assembly protecting sensitive electronic components installed therein comprising:

an enclosure having an opening therein for insertion of said components into said enclosure, an outer surface of said enclosure having a recess formed therein;

a closure member insertable into said opening to close said opening, said closure member having a channel extending into said closure member from an outer end thereof;

a sealing member including a spreader element receivable in said channel, the dimensions of said spreader element slightly exceeding those of said channel for insertion of said spreader element into said channel to force said closure member to expand outwardly against a sidewall of said opening to effectively seal the enclosure against moisture and other contaminants which may harm said components, said sealing member fiber including a locking tab engaging said recess as said spreader element is fully inserted in said channel to lock said sealing member in place;

a faceplate to which said enclosure attaches for mounting said housing assembly to said faceplate, said faceplate including a base and support members extending outwardly from said base; and, bosses formed on an outer surface of said enclosure at an opposite end of said enclosure from where said opening is formed, said bosses extending outwardly from said outer surface of said enclosure, said support members of said face plate each having a recess formed therein for receiving one of said bosses to mount said housing assembly to said faceplate.

8. A housing assembly protecting sensitive electronic components installed therein comprising:

an enclosure having an opening therein for insertion of said components into said enclosure;

a closure member insertable into said opening to close said opening, said closure member having a channel extending into said closure member from one end thereof; and, a base for said housing assembly including a wall formed adjacent one end against which one end of said enclosure abuts when said housing assembly is installed on said base, and a spreader element formed at an opposite end of said base, said spreader element comprising a projection insertable into said channel, the dimensions of said spreader element slightly exceeding those of said channel for insertion of said spreader element into said channel to force said closure member to expand outwardly against a sidewall of said opening, to effectively seal the enclosure against moisture and other contaminants which may harm said components.

9. A housing for electrical and electronic components comprising:

an enclosure open at one end for mounting components in the enclosure;

an end cap having a body formed of a deformable material and sized to fit into said open end of said enclosure to close said open end, said end cap having a bore formed in an outer face thereof and extending thereinto, said end cap further including a conduit channel extending completely therethrough for electrical leads attached to said components to be routed outside said enclosure; and, a closure member including a spreader element insertable into said bore, said spreader element being larger in diameter than said bore for insertion of said spreader element into said bore to cause said end cap to deform by expanding against a sidewall of said enclosure at said open end thereof to seal said enclosure against moisture and contaminants, and said closure member further including a locking tab engageable with a recess formed in an outer face of aid enclosure to lock said closure member and spreader element in place.

* * * * *